United States Patent
Kim

(10) Patent No.: US 9,275,718 B2
(45) Date of Patent: Mar. 1, 2016

(54) SEMICONDUCTOR DEVICES WITH PERIODIC SIGNAL GENERATION CIRCUITS AND SEMICONDUCTOR SYSTEMS INCLUDING THE SAME

(71) Applicant: SK hynix Inc., Icheon-si Gyeonggi-do (KR)

(72) Inventor: Jae Hoon Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 59 days.

(21) Appl. No.: 14/299,126

(22) Filed: Jun. 9, 2014

(65) Prior Publication Data
US 2015/0229296 A1 Aug. 13, 2015

(30) Foreign Application Priority Data
Feb. 13, 2014 (KR) .................. 10-2014-0016887

(51) Int. Cl.
*H03K 3/00* (2006.01)
*G11C 11/406* (2006.01)
*G05F 1/56* (2006.01)

(52) U.S. Cl.
CPC .... *G11C 11/40626* (2013.01); *G11C 11/40611* (2013.01); *G05F 1/56* (2013.01)

(58) Field of Classification Search
CPC .......... G11C 11/406; G11C 11/40611; G11C 11/40626
USPC ......... 327/108, 109, 111, 113, 182, 291, 512, 327/513; 365/222, 227
See application file for complete search history.

(56) References Cited

U.S. PATENT DOCUMENTS

| | | | | |
|---|---|---|---|---|
| 4,716,551 A | * | 12/1987 | Inagaki | G11C 11/406 327/187 |
| 2005/0110592 A1 | * | 5/2005 | Lee | G11C 5/147 333/16 |
| 2005/0248755 A1 | | 11/2005 | Chou et al. | |
| 2006/0023545 A1 | * | 2/2006 | Ito | G11C 7/04 365/222 |
| 2006/0067150 A1 | * | 3/2006 | Jain | G11C 11/406 365/222 |
| 2010/0182852 A1 | * | 7/2010 | Joo | G11C 5/147 365/189.09 |
| 2010/0232246 A1 | * | 9/2010 | Chung | G11C 7/04 365/222 |
| 2010/0315896 A1 | * | 12/2010 | Kim | G11C 7/04 365/212 |

FOREIGN PATENT DOCUMENTS

KR  1020100103147 A  9/2010

* cited by examiner

*Primary Examiner* — William Hernandez
(74) *Attorney, Agent, or Firm* — William Park & Associates Ltd.

(57) ABSTRACT

A semiconductor system includes a controller and a semiconductor device. The controller receives a temperature signal including information on temperature variation to generate an auto-refresh signal. The semiconductor device generates the temperature signal and controls an amount of electric charges discharged from an internal node according to temperature variation to generate a periodic signal including pulses sequentially created. The semiconductor device also receives the periodic signal or the auto-refresh signal to perform a refresh operation.

20 Claims, 5 Drawing Sheets

SEMICONDUCTOR DEVICES WITH PERIODIC SIGNAL GENERATION CIRCUITS AND SEMICONDUCTOR SYSTEMS INCLUDING THE SAME

CROSS-REFERENCE TO RELATED APPLICATION

The present application claims priority under 35 U.S.C 119(a) to Korean Application No. 10-2014-0016887, filed on Feb. 13, 2014, in the Korean Intellectual Property Office, which is incorporated herein by reference in its entirety as set forth in full.

BACKGROUND

1. Technical Field

Embodiments of the invention relate to semiconductor devices and semiconductor systems including the same and, more particularly, to semiconductor devices with periodic signal generation circuits and semiconductor systems including the same.

2. Related Art

In the electronics industry, highly integrated fast volatile memory devices such as high performance dynamic random access memory (DRAM) devices widely used as memory devices are increasingly in demand with the development of higher performance electronic systems such as personal computers or communication systems. In particular, when semiconductor devices such as the DRAM devices are employed in cellular phones or notebook computers, the semiconductor devices have to be designed to have an excellent low power consumption characteristic. Accordingly, a lot of efforts have been focused on reduction of an operation current and a standby current of the semiconductor devices.

SUMMARY

According to an embodiment, a periodic signal generation circuit includes a charge supplier, a discharge unit and a bulk voltage generator. The charge supplier compares a comparison voltage signal generated according to an amount of electric charges of an internal node with a reference voltage signal to generate a periodic signal. The charge supplier supplies electric charges to the internal node if a voltage level of the comparison voltage signal is lower than a voltage level of the reference voltage signal. The discharge unit controls an amount of electric charges discharged from the internal node according to a voltage level of a bulk voltage signal if no electric charges are supplied to the internal node. The bulk voltage generator generates the bulk voltage signal whose voltage level is controlled according to temperature variation.

According to an embodiment, a semiconductor device includes a periodic signal generation circuit and a memory region. The periodic signal generation circuit generates a bulk voltage signal with a voltage level controlled according to temperature variation. The periodic signal generation circuit also controls an amount of electric charges discharged from an internal node according to the voltage level to generate a periodic signal including pulses sequentially created. The memory region performs a refresh operation in response to the pulses of the periodic signal.

According to an embodiment, a semiconductor system includes a controller and a semiconductor device. The controller receives a temperature signal including information on temperature variation to generate an auto-refresh signal. The semiconductor device generates the temperature signal, controls an amount of electric charges discharged from an internal node according to the temperature variation to generate a periodic signal including pulses sequentially created. In addition, the semiconductor device receives the periodic signal or the auto-refresh signal to perform a refresh operation.

DETAILED DESCRIPTION

Various embodiments of the invention will be described with reference to the accompanying figures. However, the embodiments described are for illustrative purposes only and are not intended to limit the scope of the inventive concept. A data retention characteristic of a DRAM cell including a single transistor and a single storage capacitor may be very sensitive to a temperature. Thus, it may be necessary to control operation conditions of internal circuit blocks in a semiconductor integrated circuit according to variation of circumferential temperature. For example, DRAM devices employed in mobile systems may be designed to control a refresh cycle time according to variation of circumferential temperature. Temperature sensors such as digital temperature sensor regulators (DTSRs) or analog temperature sensor regulators (ATSRs) have been widely used to control the operation conditions of semiconductor devices such as DRAM devices according to variation of the circumferential temperature. These temperature sensors may detect a relatively high temperature and may control an operation cycle time to reduce power consumption in a self-refresh mode. Further, the temperature sensors may monitor a circumferential temperature in a normal operation mode. Various embodiments are directed to semiconductor devices with periodic signal generation circuits and semiconductor systems including the same.

Figure 1:
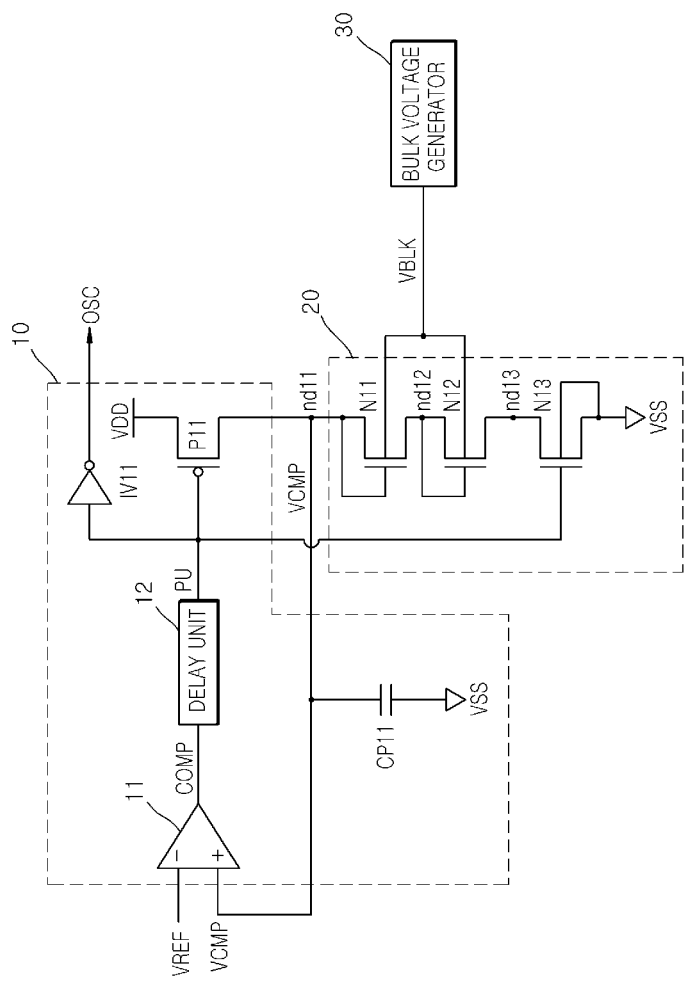
FIG. 1 is a schematic view illustrating a periodic signal generation circuit according to an embodiment of the inventive concept.

Referring to FIG. 1, a periodic signal generation circuit according to an embodiment may be configured to include a charge supplier 10, discharge unit 20 and a bulk voltage generator 30.

The charge supplier 10 may be configured to include a capacitor CP11, a comparator 11, a delay unit 12, a pull-up element P11 and a buffer IV11. The capacitor CP11 may be electrically coupled between an internal node ND11 and a ground voltage VSS terminal to store electric charges of the internal node ND11. The capacitor CP11 may also generate a comparison voltage signal VCMP according to an amount of electric charges stored in the capacitor CP11. The comparator 11 may be configured to compare the comparison voltage signal VCMP with a reference voltage signal VREF to generate a comparison signal COMP enabled when a level of the comparison voltage signal VCMP is lower than a level of the reference voltage signal VREF. The delay unit 12 may retard the comparison signal COMP by a predetermined time to generate a pull-up signal PU. The pull-up element P11, for example, such as a PMOS transistor may be turned on to supply electric charges from a power supply voltage VSS terminal to the internal node ND11 when the pull-up signal PU is enabled. The buffer IV11 may inversely buffer the pull-up signal PU to generate a periodic signal OSC. More specifically, the charge supplier 10 may compare the comparison voltage signal VCMP generated by electric charges of the internal node ND11 with the reference voltage signal VREF to generate the periodic signal OSC including pulses which are periodically created. In addition, the charge supplier 10 may supply electric charges to the internal node ND11 when a level of the comparison voltage signal VCMP is lower than a level of the reference voltage signal VREF.

The discharge unit 20 may be configured to include a first drive element N11, a second drive element N12 and a third drive element N13. The first drive element N11, for example, an NMOS transistor-type diode may be electrically coupled between the internal node ND11 and a node ND12. The NMOS transistor-type diode acting as the first drive element N11 may have four terminals such as a gate, a drain (electrically coupled with the gate), a bulk (i.e., channel body) and a source. The NMOS transistor-type diode acting as the first drive element N11 may receive a voltage signal of the internal node ND11 through the gate (i.e., the drain). The first drive element N11 may also receive a bulk voltage signal VBLK through the bulk to drift electric charges of the internal node ND11 to the node ND12 through a channel region. More specifically, the first drive element N11 may control an amount of the electric charges drifted from the internal node ND11 to the node ND12 according to a voltage difference between a voltage signal of the internal node ND11 and the bulk voltage signal VBLK applied to the bulk. The second drive element N12, for example, an NMOS transistor-type diode may be electrically coupled between the node ND12 and a node ND13. The NMOS transistor-type diode acting as the second drive element N12 may also have four terminals as the NMOS transistor-type diode acting as the first drive element N11. Accordingly, the NMOS transistor-type diode acting as the second drive element N12 may receive a voltage signal of the node ND12 through a gate (i.e., a drain). Further the second drive element N12 may receive the bulk voltage signal VBLK through a bulk to drift electric charges of the node ND12 to the node ND13 through a channel region. For instance, the second drive element N12 may control an amount of the electric charges drifted from the node ND12 to the node ND13 according to a voltage difference between a voltage signal of the node ND12 and the bulk voltage signal VBLK applied to the bulk. The third drive element N13, for example, an NMOS transistor may be electrically coupled between the node ND13 and the ground voltage VSS terminal to drift electric charges of the node ND13 to the ground voltage VSS terminal when the pull-up signal PU is disabled. More specifically, if no electric charges are supplied to the internal node ND11, the discharge unit 20 may control an amount of the electric charges drifted from the internal node ND11 to the ground voltage VSS terminal according to a voltage level of the bulk voltage signal VBLK. If a voltage level of the bulk voltage signal VBLK is lowered as the temperature falls down, the first and second drive elements N11 and N12 may then be realized using NMOS transistor-type diodes. On the contrary, if a voltage level of the bulk voltage signal VBLK increases as the temperature falls down, the first and second drive elements N11 and N12 may then be realized using PMOS transistor-type diodes.

The bulk voltage generator 30 may be configured to generate the bulk voltage signal VBLK whose voltage level is reduced as the temperature falls down.

An operation of the bulk voltage generator 30 will be described more fully with reference to FIG. 2.

Figure 2:
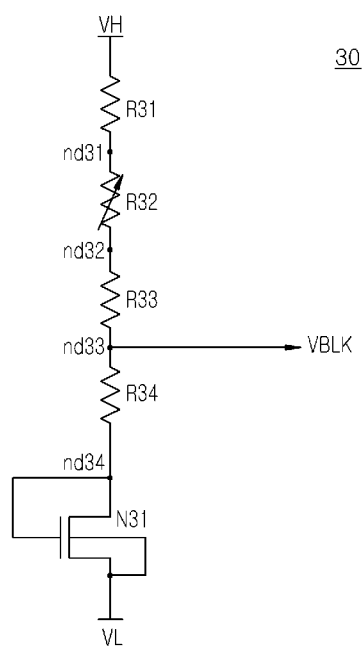
FIG. 2 is a circuit diagram illustrating a bulk voltage generator included in the periodic signal generation circuit of FIG. 1.

Referring to FIG. 2, the bulk voltage generator 30 may be configured to include a resistor R31, a variable resistor R32, a resistor R33, a resistor R34 and a fourth drive element N31. The resistor R31 may be electrically coupled between a high voltage VH terminal and a node ND31. Further, the variable resistor R32 may be electrically coupled between the node ND31 and a node ND32. In addition, the resistor R33 may be electrically coupled between the node ND32 and a node ND33. The resistor R34 may be electrically coupled between the node ND33 and a node ND34. The fourth drive element N31, for example, an NMOS transistor-type diode may be electrically coupled between the node ND34 and a low voltage VL terminal. The NMOS transistor-type diode acting as the fourth drive element N31 may have four terminals such as a gate, a drain electrically coupled to the gate, a bulk (i.e., a channel body), and a source electrically coupled to the bulk. In such a case, the NMOS transistor-type diode acting as the fourth drive element N31 may receive a voltage signal of the node ND34 through the gate (i.e., the drain). The fourth drive element N31 may also receive the low voltage signal VL through the source (i.e., the bulk) to drift electric charges of the node ND34 to the low voltage VL terminal through a channel region. An amount of drifted electric charges of the fourth drive element N31, that is, a drain current of the fourth drive element N31 may vary according to temperature variation. As a result, the bulk voltage generator 30 may divide a voltage difference between the high voltage VH terminal and the low voltage VL terminal according to resistance values of the resistors R31, R33 and R34 and the variable resistor R32 and a drain current of the fourth drive element N31. Moreover, the bulk voltage generator 30 may divide the voltage difference to generate the bulk voltage signal VBLK whose level is reduced as the temperature falls down through the node ND33. If the bulk voltage generator 30 generates the bulk voltage signal VBLK whose level is reduced as the temperature falls down, the high voltage VH terminal may correspond to a power supply voltage VDD terminal. Further, the low voltage VL terminal may have a voltage level which is lower than the ground voltage VSS. In various embodiments, the bulk voltage generator 30 may be configured to generate the bulk voltage signal VBLK whose level increases as the temperature falls down. In such an instance, the high voltage VH terminal may have a voltage level higher than the power supply voltage VDD and the low voltage VL terminal may correspond to the ground voltage VSS terminal.

An operation of the bulk voltage generator 30 having the aforementioned configuration will be described with reference to FIG. 3 in conjunction with an example. The example will show wherein a level of the bulk voltage signal VBLK is lowered as the temperature falls down. Further, an example will show wherein a level of the bulk voltage signal VBLK increases as the temperature falls down.

Figure 3:
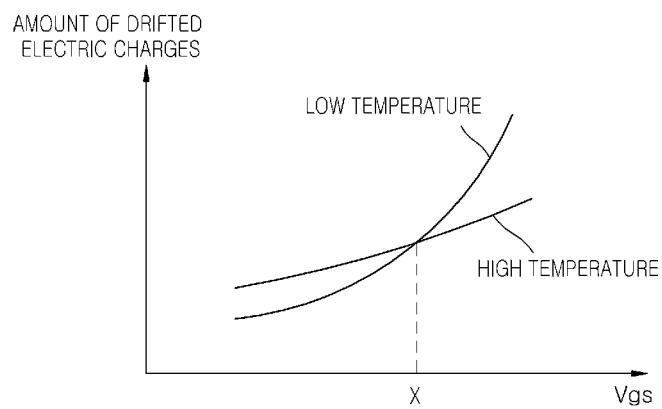
FIG. 3 is a graph illustrating an operation of the bulk voltage generator shown in FIG. 2.

Referring to FIG. 3, to generate the bulk voltage signal VBLK whose level is lowered as the temperature falls down, the variable resistor R32 should be set to have a relatively high resistance value. If the variable resistor R32 has a relatively high resistance value, a gate to source voltage Vgs of the fourth drive element N31 may then be set to be lower than "X" of FIG. 3 such that an amount of drifted electric charges (i.e., a drain current) of the fourth drive element N31 at a low temperature is less than a drain current of the fourth drive element N31 at a high temperature. As a result, a level of the bulk voltage signal VBLK may be lowered as the temperature falls down.

Next, to generate the bulk voltage signal VBLK whose level increases as the temperature falls down, the variable resistor R32 should be set to have a relatively low resistance value accordingly. If the variable resistor R32 has a relatively low resistance value, a gate to source voltage Vgs of the fourth drive element N31 may then be set to be higher than "X" of FIG. 3 such that an amount of drifted electric charges (i.e., a drain current) of the fourth drive element N31 at a low temperature is greater than a drain current of the fourth drive element N31 at a high temperature. As a result, a level of the bulk voltage signal VBLK may increase as the temperature falls down.

Figure 4:
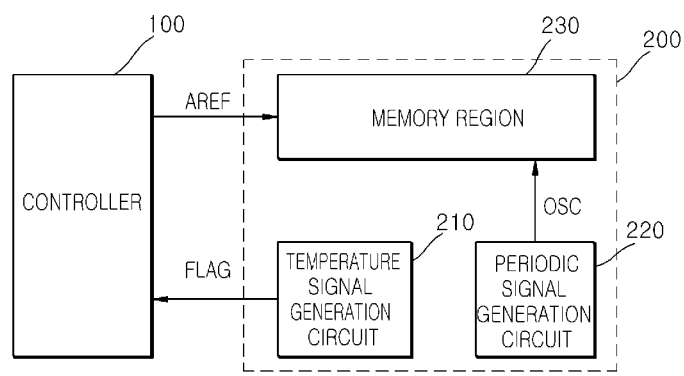
FIG. 4 is a block diagram illustrating a semiconductor system including the periodic signal generation circuit of FIG. 1.

Referring to FIG. 4, a semiconductor system according to an embodiment of the inventive concept may include a controller 100 and a semiconductor device 200.

The controller 100 may be configured to receive a temperature signal FLAG including information on temperature variation to apply an auto-refresh signal AREF to the semiconductor device 200.

The semiconductor device 200 may be configured to include a temperature signal generation circuit 210, a periodic signal generation circuit 220 and a memory region 230. The temperature signal generation circuit 210 may be configured to generate the temperature signal FLAG including the information on temperature variation. The temperature signal FLAG may be a single signal. However, in various embodiments, the temperature signal FLAG may include a plurality of signals. The periodic signal generation circuit 220 may be configured to control an amount of electric charges discharged from the internal node ND11 according to the temperature variation to generate the periodic signal OSC whose cycle changes. The periodic signal generation circuit 220 may be realized to have substantially a similar or same configuration as the circuit illustrated in FIG. 1. Therefore, a detailed description of the periodic signal generation circuit 220 will be omitted. The memory region 230 may be refreshed in response to either the auto-refresh signal AREF or the periodic signal OSC. The periodic signal OSC may be used as a signal for a self-refresh operation of the semiconductor device 200. In addition, the auto-refresh signal AREF may be used as a signal for an auto-refresh operation of the semiconductor device 200.

An operation of the semiconductor system having the aforementioned configuration will be described with reference to FIGS. 1 to 4 in conjunction with an example in which a refresh cycle is controlled when a level of the bulk voltage signal VBLK is lowered as the temperature falls down.

The variable resistor R32 of the periodic signal generation circuit 220 may be set to have a relatively high resistance value so that the gate to source voltage Vgs of the fourth drive element N31 is set to be lower than "X" of FIG. 3. As a result, a level of the bulk voltage signal VBLK may be lowered as the temperature falls down.

The charge supplier 10 of the periodic signal generation circuit 220 may compare the comparison voltage signal VCMP generated according to an amount of electric charges of the internal node ND11 with the reference voltage signal VREF. Moreover, the charge supplier 10 may perform the comparison to generate the periodic signal OSC including pulses periodically created. In addition, the charge supplier 10 may supply electric charges to the internal node ND11 if a level of the comparison voltage signal VCMP is lower than a level of the reference voltage signal VREF.

The first drive element N11 of the discharge unit 20 may receive a voltage signal of the internal node ND11 through the gate (i.e., the drain). The first drive element N11 may also receive the bulk voltage signal VBLK through the bulk to discharge the electric charges of the internal node ND11 to the node ND12. If the temperature falls down, a level of the bulk voltage signal VBLK is lowered to increase a back gate bias (a reverse bias between the source and the bulk) of the first drive element N11. In such an instance, a threshold voltage of the first drive element N11 may increase to reduce an amount of electric charges discharged from the internal node ND11 to the node ND12. The second drive element N12 of the discharge unit 20 may receive a voltage signal of the node ND12 through the gate (i.e., the drain). The second drive element N12 may also receive the bulk voltage signal VBLK through the bulk to discharge the electric charges of the node ND12 to the node ND13. If the temperature falls down, a level of the bulk voltage signal VBLK is lowered to increase a back gate bias (a reverse bias between the source and the bulk) of the second drive element N12. In such an instance, a threshold voltage of the second drive element N12 may increase to reduce an amount of electric charges discharged from the node ND12 to the node ND13. The third drive element N13 may be electrically coupled between the node ND13 and the ground voltage VSS terminal to discharge the electric charges of the node ND13 to the ground voltage VSS terminal when the pull-up signal PU is disabled. More specifically, if no electric charges are supplied to the internal node ND11 and a level of the bulk voltage signal VBLK is lowered as the temperature falls down, the discharge unit 20 may then reduce an amount of the electric charges discharged from the internal node ND11 to the ground voltage VSS terminal.

Accordingly, if the temperature falls down, the periodic signal generation circuit 220 may increase a cycle time of the periodic signal OSC because an amount of the electric charges discharged from the internal node ND11 to the ground voltage VSS terminal is reduced as the temperature falls down.

The memory region 230 may be refreshed in response to the periodic signal OSC.

Figure 5:
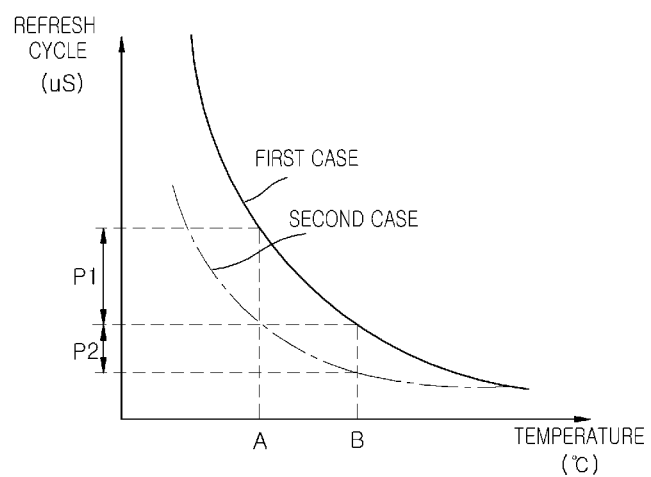
FIG. 5 is a graph illustrating an operation of the semiconductor system shown in FIG. 4 whose refresh cycle is controlled according to temperature variation.

FIG. 5 is a graph illustrating an operation of the semiconductor system shown in FIG. 4 whose refresh cycle is controlled according to temperature variation Referring to FIG. 5, if the bulk voltage generator 30 is designed such that a level of the bulk voltage signal VBLK is lowered as the temperature falls down (see "first case" of FIG. 5), a refresh cycle of the semiconductor system may then increase by a time of "P1" if the temperature falls down to "A" from "B." If the bulk voltage generator 30 is designed such that a level of the bulk voltage signal VBLK is constant even though the temperature falls down (see "second case" of FIG. 5), a refresh cycle of the semiconductor system may then increase by a time of "P2" less than "P1" if the temperature falls down to "A" from "B." More specifically, when the temperature falls down, an increment of the refresh cycle of the semiconductor system in the first case may be greater than an increment of the refresh cycle of the semiconductor system in the second case.

Figure 6:
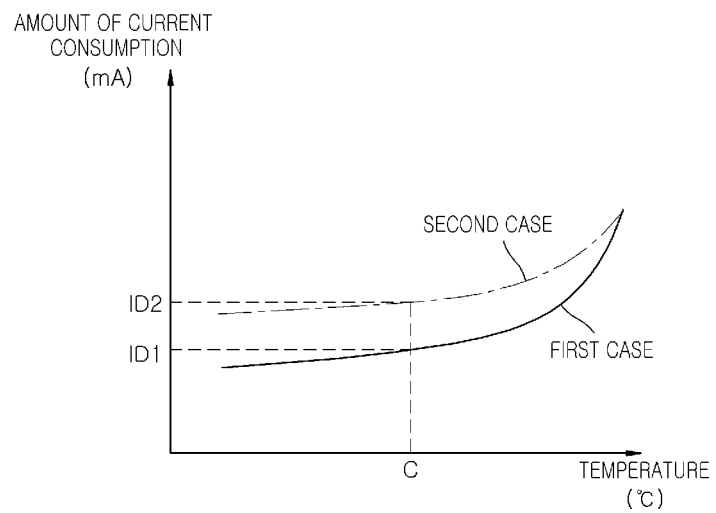
FIG. 6 is a graph illustrating an amount of current consumption of the semiconductor system shown in FIG. 4 according to temperature variation.

FIG. 6 is a graph illustrating an amount of current consumption of the semiconductor system shown in FIG. 4 according to temperature variation.

Referring to FIG. 6, if the bulk voltage generator 30 is designed such that a level of the bulk voltage signal VBLK is lowered as the temperature falls down (see "first case" of FIG.

6), a current "ID1" may flow through the semiconductor system at a temperature "C." FIG. 6 also illustrates a current "ID2" that flows through the semiconductor system at a temperature "C." If the bulk voltage generator 30 is designed such that a level of the bulk voltage signal VBLK is constant even though the temperature falls down (see "second case" of FIG. 6), a current "ID1" greater than the current "ID1" may flow through the semiconductor system at the temperature "C." More specifically, at a certain temperature, the current flowing through the semiconductor system in the first case may be less than the current flowing through the semiconductor system in the second case.

Figure 7:
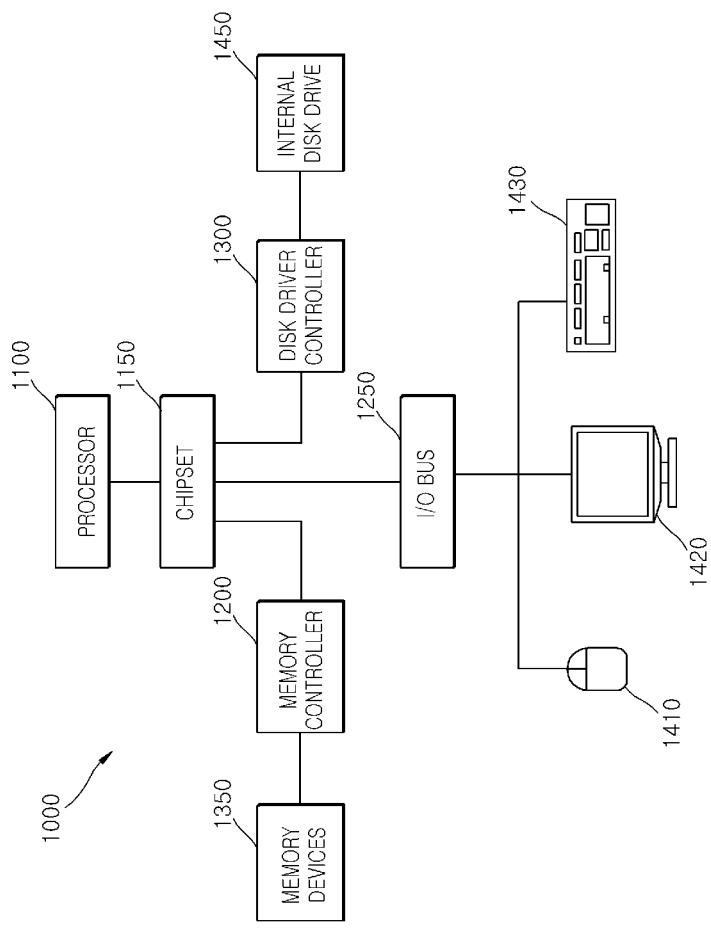
FIG. 7 illustrates a block diagram of a system employing a memory controller circuit in accordance with an embodiment of the invention.

Referring to FIG. 7 a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor system described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420 or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 110 and one or more internal disk drives 1450. The disk drive controller 1300 and the internal disk drives 1450 may communicate with each other or with the chipset 1150 using virtually any type of communication protocol.

As described above, a semiconductor system according to the embodiments may control an amount of electric charges discharged from an internal node according to temperature variation to change a refresh cycle. Accordingly, power consumption of the semiconductor system may be reduced even though the temperature varies.

What is claimed is:

1. A periodic signal generation circuit comprising:
   a charge supplier suitable for comparing a comparison voltage signal generated according to an amount of electric charges of an internal node with a reference voltage signal to generate a periodic signal, supplying electric charges to the internal node if a voltage level of the comparison voltage signal is lower than a voltage level of the reference voltage signal;
   a discharge unit suitable for controlling an amount of electric charges discharged from the internal node according to a voltage level of a bulk voltage signal if no electric charges are supplied to the internal node; and
   a bulk voltage generator suitable for generating the bulk voltage signal whose voltage level is controlled according to temperature variation.

2. The periodic signal generation circuit of claim 1, wherein a cycle time of the periodic signal increases as temperature falls down.

3. The periodic signal generation circuit of claim 1, wherein the discharge unit reduces an amount of electric charges discharged from the internal node if temperature falls down.

4. The periodic signal generation circuit of claim 1, wherein the charge supplier includes:
   a capacitor electrically coupled between the internal node and a ground voltage terminal to store electric charges of the internal node and generate the comparison voltage signal;
   a comparator suitable for generating a comparison signal enabled if a level of the comparison voltage signal is less than a level of the reference voltage signal;
   a delay unit suitable for retarding the comparison signal by a predetermined time to generate a pull-up signal;
   a pull-up element suitable for supplying electric charges from a power supply voltage terminal to the internal node in response to the pull-up signal; and
   a buffer suitable for buffering the pull-up signal to generate the periodic signal.

5. The periodic signal generation circuit of claim 1, wherein the discharge unit includes:
   a first drive element electrically coupled between the internal node and a first node, the first drive element being suitable for receiving a voltage signal of the internal node through a gate and the bulk voltage signal through a bulk to discharge electric charges of the internal node;
   a second drive element electrically coupled between the first node and a second node, the second drive element being suitable for receiving a voltage signal of the first node through a gate and the bulk voltage signal through a bulk to discharge electric charges of the first node; and
   a third drive element electrically coupled between the second node and a ground voltage terminal, the third drive element being suitable for discharging electric charges of the second node to the ground voltage terminal in response to a pull-up signal.

6. The periodic signal generation circuit of claim 5, wherein the first drive element controls an amount of electric charges discharged from the internal node according to a voltage level of the bulk voltage signal; and
   wherein the second drive element controls an amount of electric charges discharged from the first node according to a voltage level of the bulk voltage signal.

7. The periodic signal generation circuit of claim 1, wherein the bulk voltage generator includes:
   a resistor electrically coupled between a high voltage terminal and a third node through which the bulk voltage signal is outputted;
   a variable resistor electrically coupled between the third node and a fourth node; and
   a fourth drive element electrically coupled between the fourth node and a low voltage terminal,
   wherein the fourth drive element is suitable for receiving a voltage signal of the fourth node through a gate and the low voltage through a bulk to discharge electric charges of the fourth node.

8. The periodic signal generation circuit of claim 7, wherein the fourth drive element controls an amount of electric charges discharged from the fourth node according to a voltage difference between the fourth node and the low voltage terminal.

9. A semiconductor device comprising:
a periodic signal generation circuit suitable for generating a bulk voltage signal with a voltage level controlled according to temperature variation and controlling an amount of electric charges discharged from an internal node according to the voltage level to generate a periodic signal including pulses sequentially created; and
a memory region in which a refresh operation is performed in response to the pulses.

10. The semiconductor device of claim 9, wherein the periodic signal generation circuit includes:
a charge supplier suitable for comparing a comparison voltage signal generated according to an amount of electric charges of the internal node with a reference voltage signal to generate the periodic signal, and supplying electric charges to the internal node if a voltage level of the comparison voltage signal is lower than a voltage level of the reference voltage signal;
a discharge unit suitable for controlling an amount of electric charges discharged from the internal node according to the voltage level of the bulk voltage signal if no electric charges are supplied to the internal node; and
a bulk voltage generator suitable for generating the bulk voltage signal whose voltage level is controlled according to temperature variation.

11. The semiconductor device of claim 10, wherein the charge supplier includes:
a capacitor electrically coupled between the internal node and a ground voltage terminal to store electric charges of the internal node and to generate the comparison voltage signal;
a comparator suitable for generating a comparison signal enabled if a level of the comparison voltage signal is lower than a level of the reference voltage signal;
a delay unit suitable for retarding the comparison signal by a predetermined time to generate a pull-up signal;
a pull-up element suitable for supplying electric charges from a power supply voltage terminal to the internal node in response to the pull-up signal; and
a buffer suitable for buffering the pull-up signal to generate the periodic signal.

12. The semiconductor device of claim 10, wherein the discharge unit includes:
a first drive element electrically coupled between the internal node and a first node, the first drive element being suitable for receiving a voltage signal of the internal node through a gate and the bulk voltage signal through a bulk to discharge electric charges of the internal node;
a second drive element electrically coupled between the first node and a second node, the second drive element being suitable for receiving a voltage signal of the first node through a gate and the bulk voltage signal through a bulk to discharge electric charges of the first node; and
a third drive element electrically coupled between the second node and a ground voltage terminal, the third drive element being suitable for discharging electric charges of the second node to the ground voltage terminal in response to a pull-up signal.

13. The semiconductor device of claim 12,
wherein the first drive element controls an amount of electric charges discharged from the internal node according to a voltage level of the bulk voltage signal; and
wherein the second drive element controls an amount of electric charges discharged from the first node according to a voltage level of the bulk voltage signal.

14. A semiconductor system comprising:
a controller suitable for receiving a temperature signal including information on temperature variation to generate an auto-refresh signal; and
a semiconductor device suitable for generating the temperature signal, controlling an amount of electric charges discharged from an internal node according to the temperature variation to generate a periodic signal including pulses sequentially created, and receiving the periodic signal or the auto-refresh signal to perform a refresh operation.

15. The semiconductor system of claim 14, wherein the semiconductor device includes:
a temperature signal generation circuit suitable for generating the temperature signal;
a periodic signal generation circuit suitable for generating a bulk voltage signal with a voltage level controlled according to temperature variation and controlling an amount of electric charges discharged from the internal node according to the voltage level of the bulk voltage signal to generate the periodic signal; and
a memory region in which a refresh operation is performed in response to the periodic signal or the auto-refresh signal.

16. The semiconductor system of claim 15, wherein the periodic signal generation circuit includes:
a charge supplier suitable for comparing a comparison voltage signal generated according to an amount of electric charges of the internal node with a reference voltage signal to generate the periodic signal, and supplying electric charges to the internal node if a voltage level of the comparison voltage signal is lower than a voltage level of the reference voltage signal;
a discharge unit suitable for controlling an amount of electric charges discharged from the internal node according to the voltage level of the bulk voltage signal if no electric charges are supplied to the internal node; and
a bulk voltage generator suitable for generating the bulk voltage signal whose voltage level is controlled according to the temperature variation.

17. The semiconductor system of claim 16, wherein the charge supplier includes:
a capacitor electrically coupled between the internal node and a ground voltage terminal to store electric charges of the internal node and to generate the comparison voltage signal;
a comparator suitable for generating a comparison signal enabled if a level of the comparison voltage signal is lower than a level of the reference voltage signal;
a delay unit suitable for retarding the comparison signal by a predetermined time to generate a pull-up signal;
a pull-up element suitable for supplying electric charges from a power supply voltage terminal to the internal node in response to the pull-up signal; and
a buffer suitable for buffering the pull-up signal to generate the periodic signal.

18. The semiconductor system of claim 16, wherein the discharge unit includes:
a first drive element electrically coupled between the internal node and a first node, the first drive element being suitable for receiving a voltage signal of the internal node through a gate and the bulk voltage signal through a bulk to discharge electric charges of the internal node;
a second drive element electrically coupled between the first node and a second node, the second drive element being suitable for receiving a voltage signal of the first node through a gate and the bulk voltage signal through a bulk to discharge electric charges of the first node; and a third drive element electrically coupled between the second node and a ground voltage terminal, the third drive element being suitable for discharging electric charges of the second node to the ground voltage terminal in response to a pull-up signal.

19. The semiconductor system of claim 18, wherein the first drive element controls an amount of electric charges discharged from the internal node according to the voltage level of the bulk voltage signal.

20. The semiconductor system of claim 18, wherein the second drive element controls an amount of electric charges discharged from the first node according to the voltage level of the bulk voltage signal.

* * * * *